(12) United States Patent
Kim et al.

(10) Patent No.: US 9,812,222 B2
(45) Date of Patent: Nov. 7, 2017

(54) METHOD AND APPARATUS FOR IN-SYSTEM MANAGEMENT AND REPAIR OF SEMI-CONDUCTOR MEMORY FAILURE

(71) Applicant: QUALCOMM Incorporated, San Diego, CA (US)

(72) Inventors: Jung Pill Kim, San Diego, CA (US); Dexter Tamio Chun, San Diego, CA (US); Jungwon Suh, San Diego, CA (US); Deepti Vijayalakshmi Sriramagiri, San Diego, CA (US); Yanru Li, San Diego, CA (US); Mosaddiq Saifuddin, San Diego, CA (US); Xiangyu Dong, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 136 days.

(21) Appl. No.: 14/691,570

(22) Filed: Apr. 20, 2015

(65) Prior Publication Data

US 2016/0307645 A1 Oct. 20, 2016

(51) Int. Cl.
*G06F 11/00* (2006.01)
*G11C 29/44* (2006.01)
(Continued)

(52) U.S. Cl.
CPC ........ *G11C 29/4401* (2013.01); *G06F 11/073* (2013.01); *G06F 11/079* (2013.01);
(Continued)

(58) Field of Classification Search
CPC .. G06F 11/073; G06F 11/0751; G06F 11/079; G06F 11/0793; G06F 11/1048; G06F 11/1008; G06F 11/106; G06F 11/1064; G06F 11/1068; G06F 11/1072; G06F 11/1666; G11C 11/401;
(Continued)

(56) References Cited

U.S. PATENT DOCUMENTS 7,814,382 B2 * 10/2010 Sutardja .............. G06F 11/1008
365/201
8,103,900 B2 1/2012 Fry et al.
(Continued)

OTHER PUBLICATIONS

V. Schober, S. Paul and O. Picot, "Memory built-in self-repair using redundant words," Proceedings International Test Conference 2001 (Cat. No. 01CH37260), Baltimore, MD, 2001, pp. 995-1001.*
International Search Report and Written Opinion—PCT/US2016/023003—ISA/EPO—Jun. 20, 2016.

*Primary Examiner* — Bryce Bonzo
*Assistant Examiner* — Anthony J Amoroso
(74) *Attorney, Agent, or Firm* — Muncy, Geissler, Olds & Lowe, (57) ABSTRACT

A memory having a redundancy area is operated in a normal mode and an error is detected. A selecting selects between in-line repair process and off-line repair. In-line repair applies a short term error correction, which remaps a fail address to a remapped memory area of the memory. An in-system repair is applied, for a one-time programmed remapping of the fail address to a redundancy area of the memory. In-system repair utilizes idle time of the memory to maintain valid memory content.

30 Claims, 7 Drawing Sheets

(51) Int. Cl.
  *G11C 29/00* (2006.01)
  *G06F 11/07* (2006.01)
  *G06F 11/10* (2006.01)
  *G11C 29/42* (2006.01)
  *G11C 11/401* (2006.01)

(52) U.S. Cl.
  CPC ...... *G06F 11/0751* (2013.01); *G06F 11/0793* (2013.01); *G06F 11/1048* (2013.01); *G11C 29/42* (2013.01); *G11C 29/76* (2013.01); *G11C 11/401* (2013.01)

(58) Field of Classification Search
  CPC ..... G11C 29/4401; G11C 29/42; G11C 29/76; G11C 29/44; G11C 29/70; G11C 29/783; G11C 29/785; G11C 29/787; G11C 29/789
  See application file for complete search history.

(56) References Cited

U.S. PATENT DOCUMENTS

| | | |
|---|---|---|
| 8,386,836 B2 | 2/2013 | Burger et al. |
| 8,516,298 B2 | 8/2013 | Lu et al. |
| 8,621,290 B2 | 12/2013 | Daga et al. |
| 8,670,283 B2 | 3/2014 | Ong et al. |
| 9,037,928 B2 * | 5/2015 | Kleveland ............ G11C 29/44 714/710 |
| 2011/0289349 A1 * | 11/2011 | Loeser .................. G06F 11/10 714/6.24 |
| 2012/0059972 A1 | 3/2012 | Chen |
| 2014/0185397 A1 | 7/2014 | Franceschini et al. |
| 2015/0100837 A1 | 4/2015 | Ku |

\* cited by examiner

METHOD AND APPARATUS FOR IN-SYSTEM MANAGEMENT AND REPAIR OF SEMI-CONDUCTOR MEMORY FAILURE

FIELD OF DISCLOSURE

The present application is generally related to semi-conductor memory and, more particularly, to management and repair of semi-conductor memory failure.

BACKGROUND

Fail bit counts of memory devices such as dynamic random access memories (DRAMs) are known to increase in relation to reduction in feature size. Some fail bits can be detected and repaired, for example, by laser blowing of fuses or anti-fuses prior to packaging the device. Other fail bit instances, though, can manifest post-packaging. One known, conventional technique for providing memory stability is back-up memory. Back-up memory, though, can have costs, for example, hardware volume and system complexity. Other conventional techniques for post-packaging repair have various costs. For example, known repair techniques can necessitate disabling the device for the duration of the repair, and can cause loss of DRAM content.

SUMMARY

This Summary identifies some example aspects, and is not an exhaustive description of disclosed subject matter. Whether a feature is included in, or omitted from the Summary is not intended as an indicator of relative importance. Additional features and aspects are described, and will become apparent to persons skilled in the art upon reading the following detailed description and viewing the drawings that form a part thereof.

Various methods and systems providing system memory repair are disclosed. In one or more example methods according to this disclosure, operations can include detecting an error, as a detected error, and the detected error may be associated with accessing the memory and, upon detecting the error, operations may include selecting a repair process, based on a selection criterion, and the repair process may be selected from the group consisting of an in-line repair process and an off-line repair process. In an aspect, upon selecting the in-line repair process, operations may include performing the in-line repair process. Performing the in-line repair process may include applying a short-term error correction, and the short-term error correction may comprise a short-term remapping of a fail address in the memory to a remapped memory area of the memory, and upon a successful completion of the short-term error correction, applying an in-system repair. In an aspect, applying the in-system repair may comprise a one-time programmed remapping of the remapped memory area to a redundancy area of the memory.

Examples of apparatuses according to this disclosure can provide in-system repair management of a memory. One or more example apparatuses according to this disclosure may comprise means for detecting, during a normal mode operation of the memory, an error and a corresponding fail address in the memory, and means for selecting, upon detecting the error, a repair process. In an aspect, the selecting may select the repair process from the group consisting of an in-line repair process and an off-line repair process, and the selecting may be based, at least in part, on a given selection criterion. In an aspect, the apparatus may further comprise means for performing the in-line repair process, which may include means for applying a short-term error correction that, upon successful completion, can include a short-term remapping of the fail address in the memory to a remapped memory area of the memory, means for applying an in-system repair. In an aspect, the means for applying an in-system repair may be configured wherein the in-system repair can include a one-time programmed remapping of the remapped memory area to a redundancy area of the memory.

Other examples of apparatuses according to this disclosure can comprise a redundancy memory, having a normal area and a redundancy area, and an error detection module. In an aspect, the error detection module can be configured to detect an error in an access of the redundancy memory and, in response, generate an error notice and a memory fail address. In an aspect, the apparatus may further include an in-system/off-line repair process selection module, and the in-system/off-line repair process selection module may be configured to select, upon the error notice, a repair process from the group consisting of an in-line repair process and an off-line repair process. In an aspect, the selecting can be based, at least in part, on a given selection criterion. In an aspect, the apparatus may further comprise an in-line repair process module, and the in-line repair process module may comprise a short-term error correction module, which may be configured to perform a temporary remapping of the fail address to a remapped memory area, wherein the remapped memory area is in the normal area of the of the redundancy memory. The in-line repair process module, in an aspect, may further comprise an in-system repair module, which may be configured to one-time program a redundancy circuitry with a one-time programmed remapping of the fail address to a redundancy area of the memory.

Examples according to this disclosure also include a computer readable tangible medium which can comprise instructions that, when read and executed by a processor, cause the processor to detect an error, during a normal mode operating of a redundancy memory, and to select, upon detecting the error, a repair process, based on a section criterion. In an aspect, the repair process may be in a group including an in-line repair process and an off-line repair process. The instructions, in an aspect can include instructions that, when read and executed by a processor, cause the processor, upon selecting the in-line repair process, to apply a short-term error correction, wherein the short-term error correction may be configured to provide, upon a successful completion, a short-term remapping of a fail address in the memory to a remapped memory area of the memory. The instructions, in an aspect, can also include instructions that, when read and executed by a processor, cause the processor, upon the successful completion of the short-term error correction, to apply an in-system repair, configured to provide a one-time programmed remapping of the remapped memory area to a redundancy area of the memory.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects and example applications, configuration and operations of the same are disclosed in the following written description and related drawings. Alternate configurations may be devised without departing from the scope of the invention. In certain described example implementations, instances are identified where various component structures and portions of operations can be taken from known, conventional techniques, and then arranged and combined with other described structures and operations to form the implementation. In such instances, internal details of the known, conventional component structures and/or portions of operations are omitted to help avoid potential obfuscation of inventive concepts.

The word "exemplary," as used herein, means "serving as an example, instance, or illustration."

As used herein, the singular forms "a", "an" and "the" are intended to include the plural forms as well, unless the context clearly indicates otherwise. The terms "comprises", "comprising," "includes" and/or "including", as used herein, specify the presence of stated features, integers, steps, operations, elements, and/or components, but do not preclude the presence or addition of one or more other features, integers, steps, operations, elements, components, and/or groups thereof.

Examples according to certain aspects are described in terms of operations and steps. It will be understood that except where explicitly stated otherwise, or where made clear from the context, the described order of such operations and steps is only for purposes of example, and is not necessarily a limitation on the order of performing operations or steps.

Operations in certain processes are described in reference to flow diagrams. It will be understood that the blocks in the flow diagrams do not necessarily mean that operations shown by the block terminate upon commencement of operations shown by another block.

Certain operations, steps, actions and sequences of the same can be performed by or under control of, a computing device or elements of a computing device. As will be understood by persons of ordinary skill, such operations, steps, actions, sequences and combinations thereof can be performed by, or under control of specific circuits (e.g., application specific integrated circuits (ASICs)), by program instructions being executed by one or more processors, or by a combination of both. It will be appreciated by such persons that operations, steps, actions, sequences of the same can be implemented entirely within any form of computer readable storage medium as a corresponding stored set of computer instructions that, upon execution, can cause an associated processor to perform, directly or indirectly, operations, steps, actions, sequences and other combinations described herein. Thus, the various aspects of the invention may be implemented in a number of different forms, all of which are contemplated to be within the scope of the appended claims.

Figure 1:
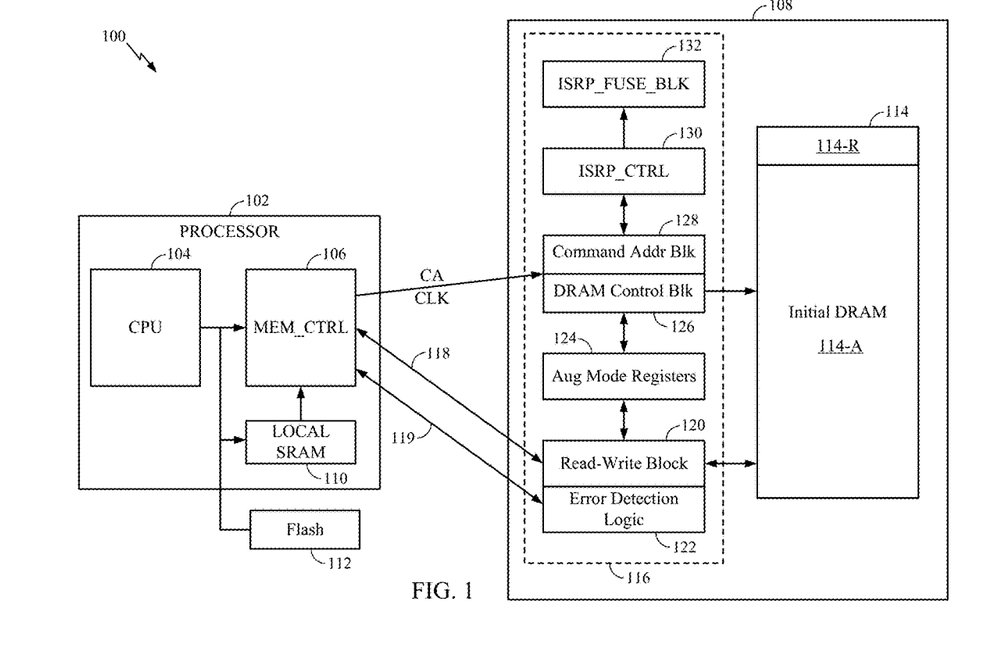
FIG. 1 shows a functional block schematic of one example processor system with in-system error managed memory, according to one or more aspects.

FIG. 1 shows a functional block schematic of one processor system 100 configured in accordance with one or more exemplary aspects. The processor system 100 may comprise a processor 102 having, for example, a CPU 104 and a memory controller 106 and, external to processor 102, a DRAM unit 108. In an aspect, the processor 102 may be implemented as a system-on-chip (SOC) processor device. In an aspect, the processor 102 may include a local static RAM (SRAM) SRAM 110, and may include a non-volatile memory, such as a flash memory 112. The flash memory 112 may be external to the processor 102, or internal to the processor 102, or both Referring to FIG. 1, the DRAM unit 108 may include a DRAM device 114 and a DRAM local control logic 116, which is described later in greater detail. The DRAM device 114 may include an initial array of DRAM cells 114A (hereinafter "DRAM initial area 114A"), where "initial" can mean configured as addressable at time of fabrication. The DRAM device 114 may be configured, for example, in accordance with conventional row-column addressable DRAM cell array (not separately visible in FIG. 1) techniques. The DRAM device 114 may also include known, conventional technique DRAM word line and bit line decoders (not separately visible in FIG. 1), DRAM read circuitry, e.g., sense amplifiers (not separately visible in FIG. 1), and DRAM write circuitry (not separately visible in FIG. 1). In an aspect, the DRAM device 114 may also comprise a resource of redundant DRAM cells 114R, hereinafter "Redundancy"114R. The Redundancy 114R may be structured according to known, conventional DRAM redundancy techniques.

Referring to FIG. 1, a bus 118 may couple the DRAM local control logic 116 to the memory controller 106. The bus 118 may be configured according to known, conventional processor bus techniques, and functionality may include carrying access addresses, access commands, and write data (not separately visible in FIG. 1) from the memory controller 106 to the DRAM local control logic 116, and read data from the DRAM device 114, via the DRAM local control logic 116, to the memory controller 106. In an aspect, the DRAM local control logic 116 may include a read-write control block 120 that may be configured to interface to the bus 118 for receiving the access addresses, access commands and write data, and for performing appropriate access of the DRAM device 114. Configuration of the read-write control block 120 is not necessarily particular to the disclosed aspects and, for example, may be according to known conventional DRAM read/write access controller techniques.

In an aspect, an error detection logic 122 may be configured to check for bit errors in data read from the DRAM device 114. The error detection logic 122 may be configured to generate, upon detecting an error, an error detect signal, e.g., "error flag" (not separately labeled in FIG. 1). In an aspect, the error flag may include information identifying the fail address in the DRAM device 114. In an aspect, the error detection logic 122 may be configured to both detect and correct up to an R-bit error, and generate the error flag with an indicia (not separately visible in FIG. 1) that the error was correctable.

In an aspect, a dedicated control line, such as the back channel 119, may connect the memory controller 106 directly to the error detection logic 122.

Referring to FIG. 1, the DRAM local control logic 116 may, in an aspect, include an augmented mode register set 124 (hereinafter "augmented mode registers" 124). The augmented mode registers" 124 may include mode registers (not separately visible in FIG. 1) for holding DRAM control information (e.g., DRAM refresh information) according to conventional DRAM mode register techniques. In an aspect, the augmented mode registers 124 may also be configured with in-system repair registers (not separately visible in FIG. 1) for use in repairing a failed address as later described in greater detail later. In an aspect, the back channel 119 may also be configured to provide the memory controller 106 with direct access to the augmented mode registers 124.

In an aspect, DRAM local control logic 116 may include a DRAM control block 126, which may be configured to control DRAM refresh operations for maintaining validity of data content in the DRAM device 114. DRAM refresh operations controlled by the DRAM control block 126 may be based, at least in part, on DRAM refresh information held by the augmented mode registers 124.

Continuing to refer to FIG. 1, in an aspect, the DRAM local control logic 116 may include a command address block 128, an in-system repair controller 130 (hereinafter "ISRP_CTRL 130"), and an in-system repair fuse block 132 (hereinafter "ISRP_FUSE_BLK 132"). It will be understood that "ISRP_CTRL" and "ISRP_FUSE BLK," as used in this disclosure, are labels having no inherent meaning. In an aspect, the command address block 128 may be configured to provide to the ISRP_CTRL 130 addresses (not explicitly visible in FIG. 1) or address ranges of the fuses or anti-fuses in the ISRP_FUSE_BLK 132 that, if programmed, will permanently remap a failed address in the DRAM initial area 114A of the DRAM device 114 to the Redundancy 114R. In an aspect, the ISRP_CTRL 130 may be configured, in turn, to apply one-time programming pulses (not explicitly visible in FIG. 1) to the appropriate fuses or anti-fuses in the ISRP_FUSE_BLK 132. In an aspect, the command address block 128 may be further configured to maintain a running inventory of, or determine (e.g., in response to a query from the memory controller 106) a remaining area in the Redundancy 114R.

Figure 2:
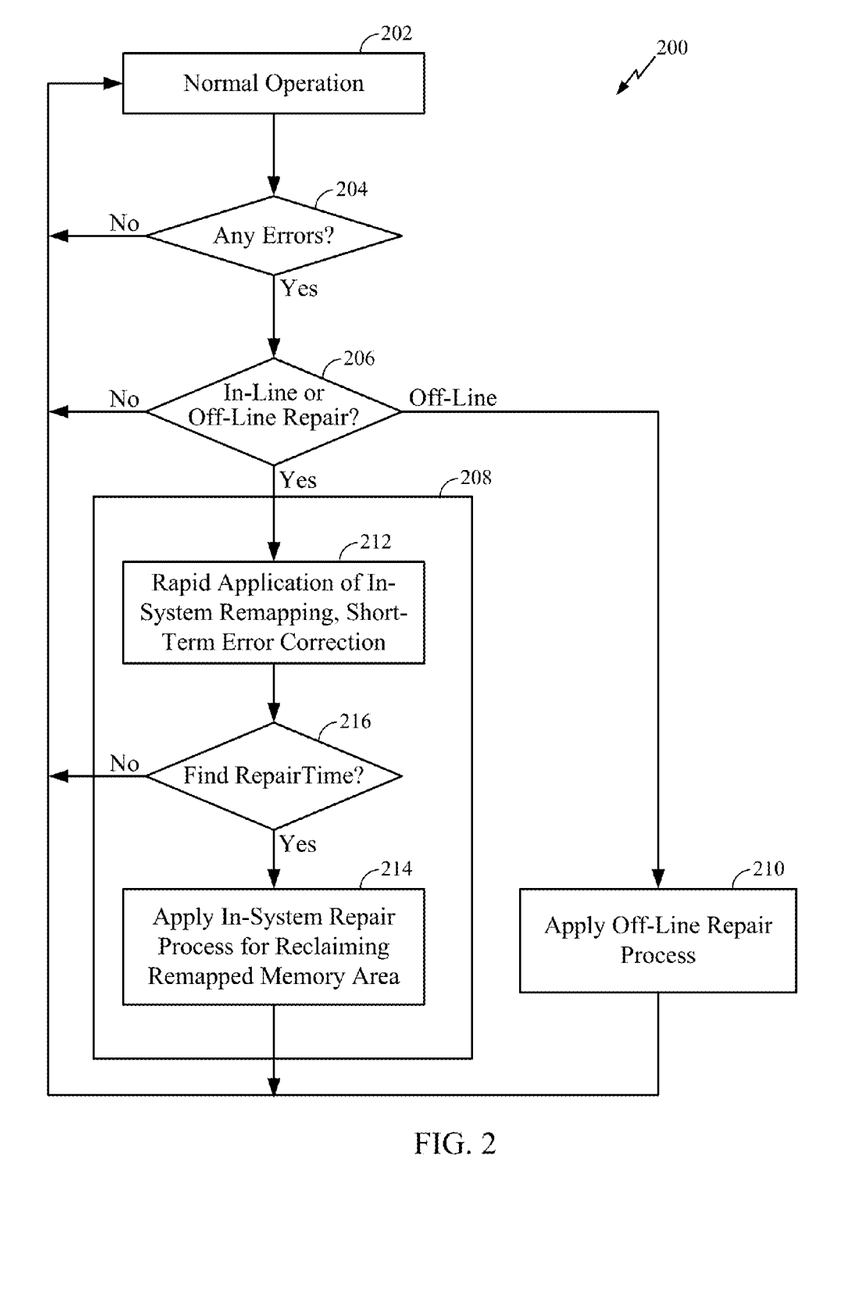
FIG. 2 shows a flow diagram of example operations in one process of in-system memory management process in methods and systems of in-system memory error management according to various aspects.

FIG. 2 shows a flow diagram 200 (hereinafter "flow 200") of operations in one in-system error management process according to various aspects. To avoid obfuscation of concepts, example operations in the flow 200 are described in reference to the processor system 100 and its DRAM device 114. It will be understood that such description is not intended to limit the scope of aspects to the processor system 100.

Operations in the flow 200 can start at 202 with a normal mode operation that includes accessing the DRAM device 114. Illustrative, non-limiting examples include web browsing, gaming, texting, emailing, multi-media recording and playback, as well as calendar/planning applications, word processing and operating system activity. In an aspect, accesses of the DRAM device 114 during the normal mode operation at 202 can include error checking at 204, for example, by the error detection logic 122. In an aspect, included in the error checking at 204 may be a generating of a flag (not explicitly visible in FIG. 2) such as the previously described error flag generated by the error detection logic 122, along with identification of the fail address in the DRAM device 114. The fail address included in the error flag or may be stored, for example, in the augmented mode registers 124.

Referring to FIG. 2, upon the error checking at 204 detecting an error, which is shown by the "Yes" flow out from block 204, the flow 200 may proceed to 206 and apply repair decision operations. Repair decision operations at 206 can be configured to select between in-line repair, off-line repair, and no (i.e., to forego) repair. The latter may correspond to the "NO" branch from 206 back to normal mode operation at 202. Regarding the decision to forego repair, in an aspect, repair decision operations at 206 may include determining, in response to an error detected at 204 being correctable, whether that error is a repeating error. In a related aspect, the repair decision operations at 206 may be configured to forego repair, e.g., return to 202, upon determining that a detected correctable error is not a repeating error. Example operations in determining whether a detected correctable error is a repeating error, and therefore foregoing repair, are described in greater detail later. Referring to FIGS. 1 and 2, the error detection logic 122 may be configured to determine whether a detected correctable error is a repeating error.

In addition to determining whether a detected correctable error is a repeating error, repair decision operations at 206 for selecting between proceeding to 208 and applying an in-line repair, or to 210 and applying an off-line repair may be based on various other criteria. In an aspect, repair decision operations at 206 may include receiving information (not explicitly visible in FIG. 2) indicating a quantity of remaining memory space in the Redundancy 114-R. As one example, the augmented mode registers 124 may be configured to store information indicating remaining memory space in the redundancy 114-R. For convenient description of example operations, information indicating remaining memory space in the redundancy 114-R will be referred to as "available redundancy information." In a related aspect, the memory controller 106 may be configured to inspect the augmented mode registers 124 and obtain the available redundancy information, for example, in response to receiving the error flag.

Referring to FIG. 2, operations in the in-line repair at 208 will now be described. In an aspect, the in-line repair at 208 may be configured as a two-stage repair process, comprising, as the first stage, an in-system short-term remapping at 212 and, as the second stage, an in-system memory area reclaiming process at 214. In an aspect, both the first stage and second stage may be configured to execute within time intervals that can avoid interruption of normal mode operation at 202. The in-system short-term remapping at 212 may comprise a rapidly applied remapping of the fail address to an area (not explicitly visible in FIG. 1) of the initial DRAM 114A that will be termed in this disclosure as "the remapped memory area." The remapped memory area, in an aspect, may be within a larger, reserved area (not explicitly visible in FIG. 1) which will be referred to as "reserved remapping pages" that may be reserved for remapping of the fail address of the initial DRAM 114A. The reserved remapping pages may be reserved, for example, by a start-up partitioning (not explicitly visible in FIG. 2) of the DRAM initial areas 114-A, described in greater detail later. The in-system memory area reclaiming process at 214 is termed a "reclaiming process" because, if successful, it reclaims that remapped memory area in the reserved remapping pages to which the fail address was temporarily remapped at 210. The reclaimed area can then be used, for example, for a subsequent in-system short-term remapping at 210.

Referring to FIG. 2, in an aspect, upon completion of the first stage, i.e., the short term remapping at 212, the in-line repair at 208 may apply the second stage, which is the in-system memory area reclaiming process at 214. In an aspect, the in-system memory area reclaiming process at 214 may include a one-time programming of a remapping of the fail address to the Redundancy 114R. That one-time programming may include programming fuses in the ISRP_FUSE_BLK 132, which can require time. In an aspect, though, the one-time programming may be performed, as described in greater detail later, without interfering with normal mode operations at 206. According to this aspect, prior to the in-system memory area reclaiming process at 214 there may be a determining at 216 of whether there is sufficient available repair time on the DRAM device 114 to perform the one-time programming, without interfering with normal mode operation. If the determination at 216 is "YES" (or the determination at 216 is omitted) the in-line repair 208 can proceed to 214 and apply the in-system memory area reclaiming process. Upon successful completion, the remapping of the fail address to the Redundancy 114R is one-time programmed, in other words, burnt into the ISRP_FUSE_BLK. The remapping area in the reserved remapping pages is therefore reclaimed.

Figure 3:
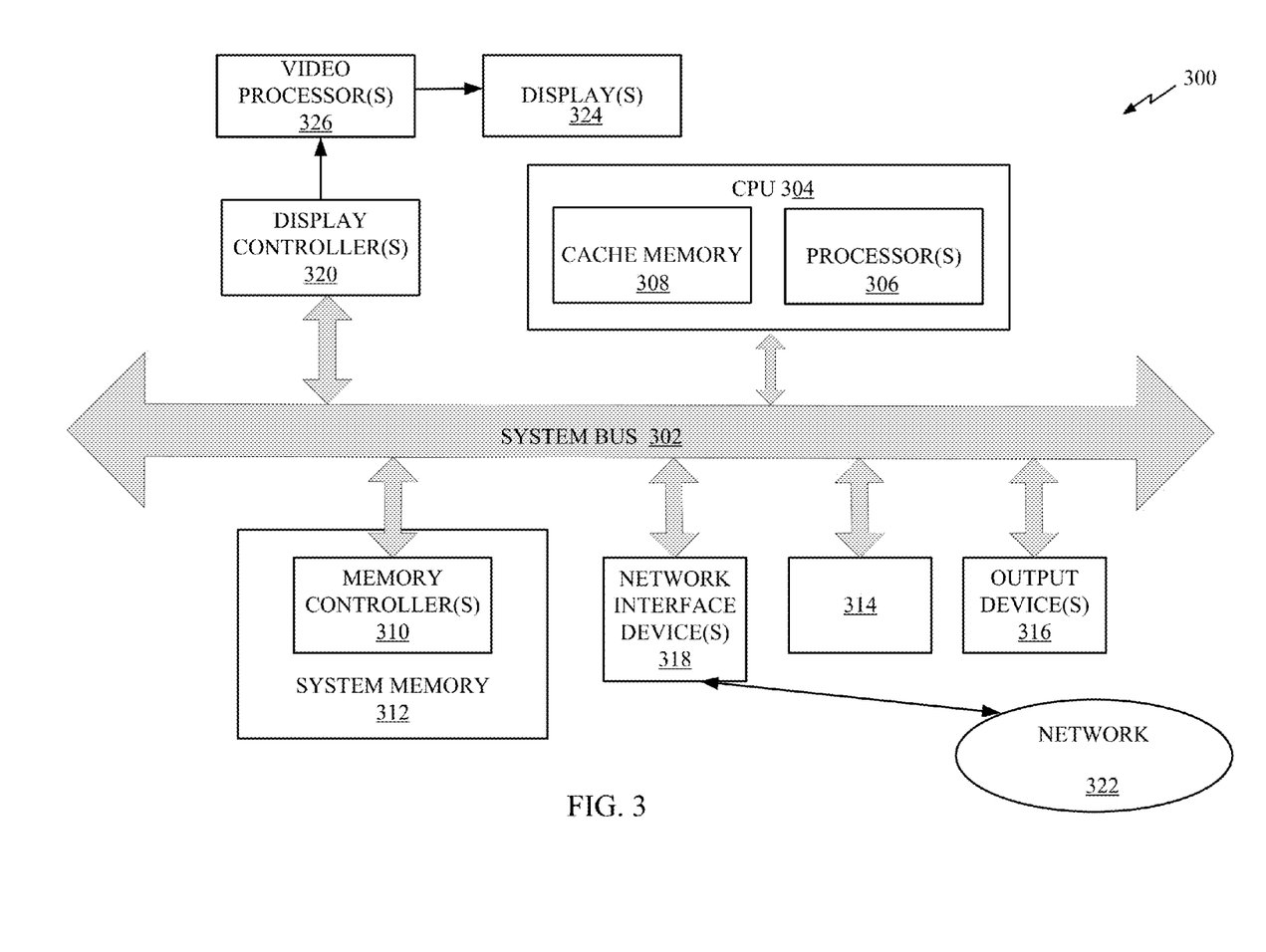
FIG. 3 shows a functional schematic of one example personal communication and computing device in accordance with one or more exemplary aspects.

FIG. 3 illustrates one example of a personal communication and computing device 300 that can be configured, as described herein, to support or provide functionalities and features described in reference to the FIG. 1 processor system 100. Referring to FIG. 3, the personal communication and computing device 300 can include a system bus 302 and, coupled to the system bus 302, one or more CPUs 304. The CPU(s) 304 may comprise, for example, one or more processors 306 and one or more cache memories 308. The processors 306 may be implemented by, for example, one or more programmable computing devices such as, without limitation, one or more ARM-type processing devices (not separately visible in FIG. 3). The CPU(s) 304 may be capable of performing as a master device. The CPU(s) 304 may be inter-coupled, for example through the system bus 302, to various master and slave devices. The CPUs 304 may, according to conventional communication protocols, communicate with these other devices by exchanging address, control, and data information over the system bus 302. Although not illustrated in FIG. 3, multiple system buses 302 may be provided. In examples having multiple system buses 302, each system bus 302 may constitute a different fabric.

Referring to FIG. 3, the CPU(s) 304 may communicate bus transaction requests to a memory controller 310 of a memory system 312 as one example of a slave device.

In one aspect, the CPU 304 may correspond to processor 102 of FIG. 1 and the memory controller 310 may correspond to the memory controller 106 of FIG. 1. The memory system 312, in an aspect, may comprise a DRAM that includes redundancy resources comparable to the above-described Redundancy 114R. The memory system 312 may be configured to include, or to be associated with DRAM control circuitry (not explicitly visible in FIG. 3) having functionality as described for the DRAM local control logic 116. In an aspect, one or more of the system bus 302, the CPU(s) 304 and the memory system 312 may include, or support a dedicated control line (not explicitly visible in FIG. 3), such as the FIG. 1 back channel 119, to connect the memory controller 310 or equivalent directly to an error logic block (not explicitly visible in FIG. 3) having functionality such as the FIG. 1 error detection logic 122 of the DRAM local control logic 116.

The above-described arrangement of the FIG. 1 processor system 100 on the personal communication and computing device 300 is only an example. Those having skill in the art will appreciate that the various elements of FIG. 1 may be distributed throughout the computing device 300 in other arrangements without departing from the spirit of this disclosure.

Referring to FIG. 3, examples of other master and slave devices can include one or more input devices 314, one or more output devices 316, one or more network interface devices 318, and one or more display controllers 320. The input devices(s) 314, if employed, can include any type of input device, including but not limited to input keys, switches, voice processors, and the like. The output device(s) 316, if used, can include any type of output device, including but not limited to audio, video, other visual indicators and the like. The network interface device(s) 318, if used, can be any type of network interface device configured to allow exchange of data to and from a network 322. The network 322 can be any type of network, including but not limited to a wired or wireless network, a private or public network, a local area network (LAN), a wide area network (WLAN) and the Internet. The network interface device(s) 318 can be configured to support any type of communications protocol desired.

Continuing to refer to FIG. 3, the CPU(s) 304 may also be configured to access the display controller(s) 320 over the system bus 302 to control information sent to one or more displays 324. The display controller(s) 320 may send information to the display(s) 324 to be displayed, for example, via one or more video processors 326. The video processors 326 may process, for example, information to be displayed into a format suitable for the display(s) 324. The display(s) 324, if used, can include any type of display, for example, an active or passive liquid crystal display (LCD), a plasma display, and cathode ray tube (CRT).

Figure 4:
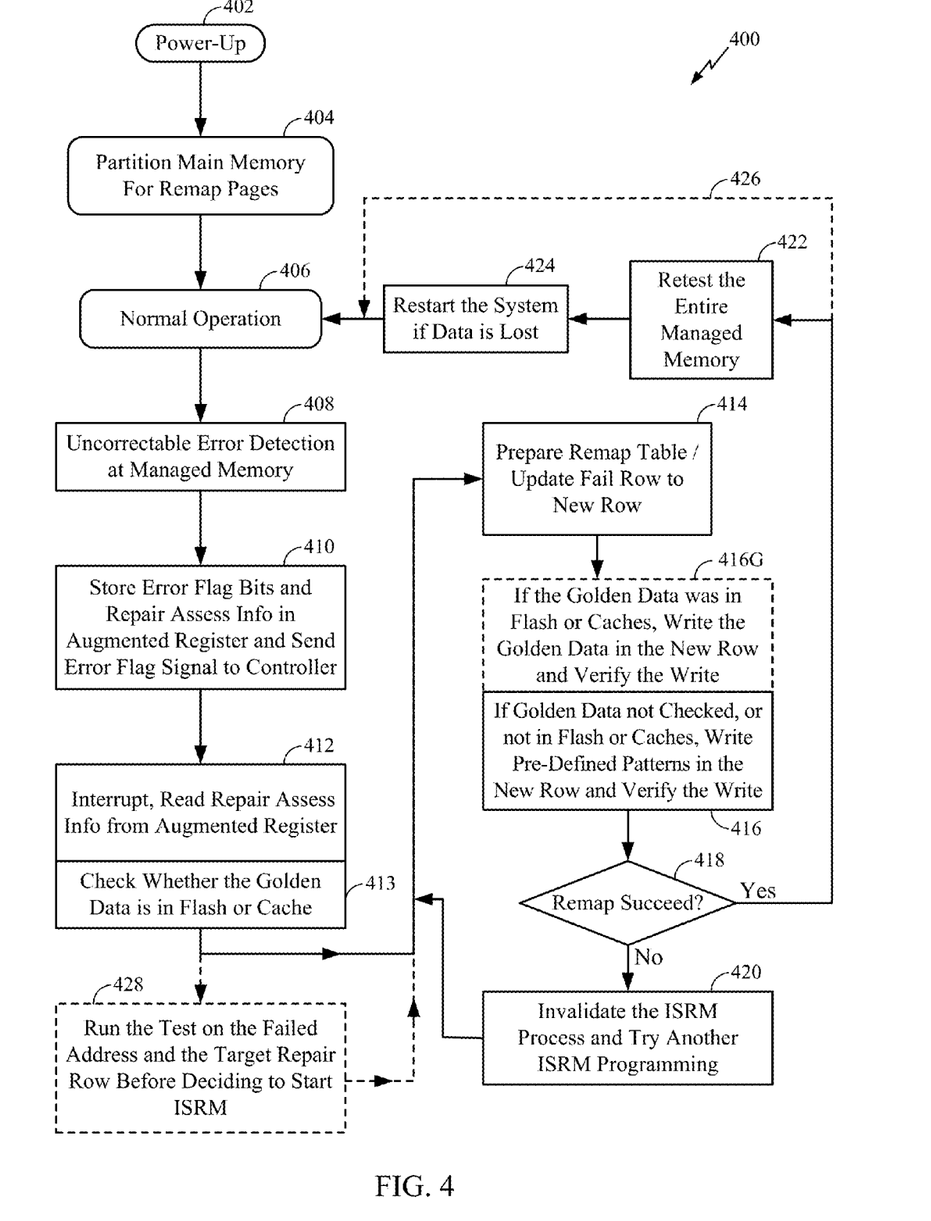
FIG. 4 shows a flow diagram of example operations in a short-term remapping process in association with un-correctable error, in methods and systems of in-system memory error management according to various aspects.

FIG. 4 shows a flow diagram 400 (hereinafter "flow 400") of example operations in one uncorrectable error detection and short-term remapping process according to various aspects. Operations in the flow 400 are examples of operations that may be within an in-system error management process according to the FIG. 2 flow 200. Operations in the flow 400 will be described in reference to the FIG. 1 processor system 100. Persons of ordinary skill in the art can readily map the described operations to the FIG. 3 personal communication and computing device 300.

In an aspect, and as will be described in greater detail, certain operations in the flow 400 may be omitted. For each, omission or inclusion is a design choice that is dependent, in part, on application-specific factors that, upon reading this disclosure, can be readily identified by persons of ordinary skill when facing an application. For example, in an aspect, the flow 400 may include or may omit a testing of the fail address and the target repair row in the remapped memory area of the before proceeding. Referring to FIG. 4, graphical block 428 represents one example logical arrangement of such operations within the flow 400. To assist in understanding concepts, a first example process according to the flow 400 will be described omitting graphical block 428. It will be understood that the above-described example operations in the flow 400 that may be omitted is non-limiting. Other examples of such operations will be described in greater detail.

Referring to FIG. 4, example operations in a process according the flow 400 may start with a power-up at 402 and, at 404, a partitioning of the FIG. 1 DRAM initial area 114A to reserve mapping pages. The flow 400 may proceed to 406 and perform normal mode operations that include access of the DRAM device 114. The normal mode operations at 406 may comprise, for example, the FIG. 2 normal mode operations at 202 with error checking at 204. Upon detecting at 408 of an un-correctable error in an access of the DRAM device 114, a fail address, the available redundancy information and error flag bits may be stored, for example, in the augmented mode registers 124. The available redundancy information stored at 410 may include, for example, a latest, or running inventory of a remaining area in the Redundancy 114R. For brevity, the fail address and available redundancy information may be collectively referenced as "repair assessment information" (labeled in block 410 as "Repair Assess Info"). The error flag may be the sent from the error detection logic 122, over the back channel 119, to the memory controller 106 of the processor 102.

Continuing to refer to FIGS. 1 and 4, at 412, upon receiving the error flag signal or equivalent notice, the memory controller 106 may interrupt the DRAM device 114, and read the repair assessment information. Operations at 412 may comprise, for example, the FIG. 1 memory controller 106 accessing the augmented mode registers 124, over the back channel 119, and reading the fail address and available redundancy information.

In an aspect, the memory controller 106 may also check, at 413, to determine whether particular data referred to in this description as "golden data" is accessible, in a memory outside of the DRAM device 114. The term "golden data", as used herein, can mean a data of known validity for which a copy should have been in the DRAM device 114 at the fail address but, as indicated by the detected error, the integrity of that copy may have been compromised. The "golden data" can also mean other data of known validity that, upon normal operations immediately succeeding the short-term remapping process according to the flow 400, should be in the DRAM device 114 at the now remapped memory area. Utilization and accommodation of golden data in operations according to the flow 400 may be included, and may be omitted and are referred to in this description as the "golden data option." Referring to FIG. 1, if the golden data option is utilized, checking at 413 may be employed. Example operations of the checking at 413 may comprise the memory controller 106 determining whether the golden data is in, for example, the flash memory 112 or the local SRAM 110.

Referring to FIG. 4, in an aspect, upon reading the repair assessment information at 412 and, if the golden data option is utilized, after checking whether the golden data is in flash or cache at 413, the flow 400 may proceed directly to 414. Operations at graphical block 428, which are optional, are described later in greater detail. At 414 a device, such the memory controller 106 or other memory management unit (MMU), may prepare a remapping table, and update the fail row to a new row in the reserved mapping pages of the DRAM initial area 114A.

After 414 the flow 400 can depend on whether the golden data option (at 413) is utilized or not utilized. In an aspect, if the golden data option at 413 is not utilized, or if the golden data option at 413 was utilized but the golden data was not identified as accessible in a memory outside of the DRAM device, the flow 400 can proceed to 416. At 416, the memory controller 106 may write, or control a writing of predefined patterns in the new row in the reserved mapping pages of the DRAM initial area 114A. In an aspect, the memory controller 106 may also, at 416, verify the write of the predefined pattern. In an aspect in which the golden data option at 413 is utilized and the golden data is found, for example, in a cache or flash (e.g., the FIG. 1 flash memory 112), the flow 400 can proceed to 416G instead of 416. At 416G the memory controller 106 may write that golden data in the new row in the reserved mapping pages and, in an aspect, may verify the write. If either the verifying at 416 or 416G shows their respective write was not successful then, as shown by the "NO" output of the decision block at 418, remapping of the fail address did not succeed, whereupon the flow 400 may proceed to 420 and perform operations that invalidate current in-system repair management process. In an aspect, also at 420, another in-system repair management process may be applied.

Continuing to refer to FIG. 4, if the verifying at 416 or at 416G shows a correct write/read of the predefined pattern (or the golden data) in the new row, the remapping may be determined successful, as shown by the YES output of the decision block 418. In an aspect, represented as path 420, the flow 400 may return to normal mode operation at 406. In another aspect, the flow 400 may be configured to proceed, after a YES output of the decision block 418, to 422 and apply a retesting of the entire DRAM device. The retesting of the entire DRAM device at 422, in an aspect, may be omitted. In another aspect, after a successful retesting at 422 or, if the retesting at 422 is omitted, immediately after determining a successful remapping at 420, the flow 400 may proceed to 424. Operations at 424 can including determining whether data content of the DRAM device 114 was lost such that a recovery is required. If the determining at 424 is that data has been lost then, before resuming normal mode operations, a system restart may be applied. In an aspect, block 424 may be replaced by a block that applies a system restart without specific determination of whether data has been lost. In another aspect, as represented by logical path 426, the flow may omit both the operations at 422 of retesting of the entire DRAM device at 422 and the operations at 424, and proceed to a normal operation 406 immediately from the YES output of the decision block 418.

Referring to FIG. 4, as previously described, in an aspect the flow 400, instead of passing directly from operations at 412 (with or without operations at 413) to 414, may proceed to 428 and perform operations of testing the fail address detected at 408 and the target repair row in the Redundancy 114R of the DRAM device 114. Operations at 428 of testing the target repair row in the Redundancy 114R of the DRAM device 114 may include accessing, for example by the memory controller 106, areas within the Redundancy 114R. Operations in such accessing may include the memory controller 106 obtaining specifications from, for example, the augmented registers 124. In an aspect, detection of a failure (or proper operation) by the testing at 428 may be followed by a return to normal operation at 406 (e.g., if the fail address tests as operating properly), or a system exception (not explicitly visible in FIG. 4).

Figure 5:
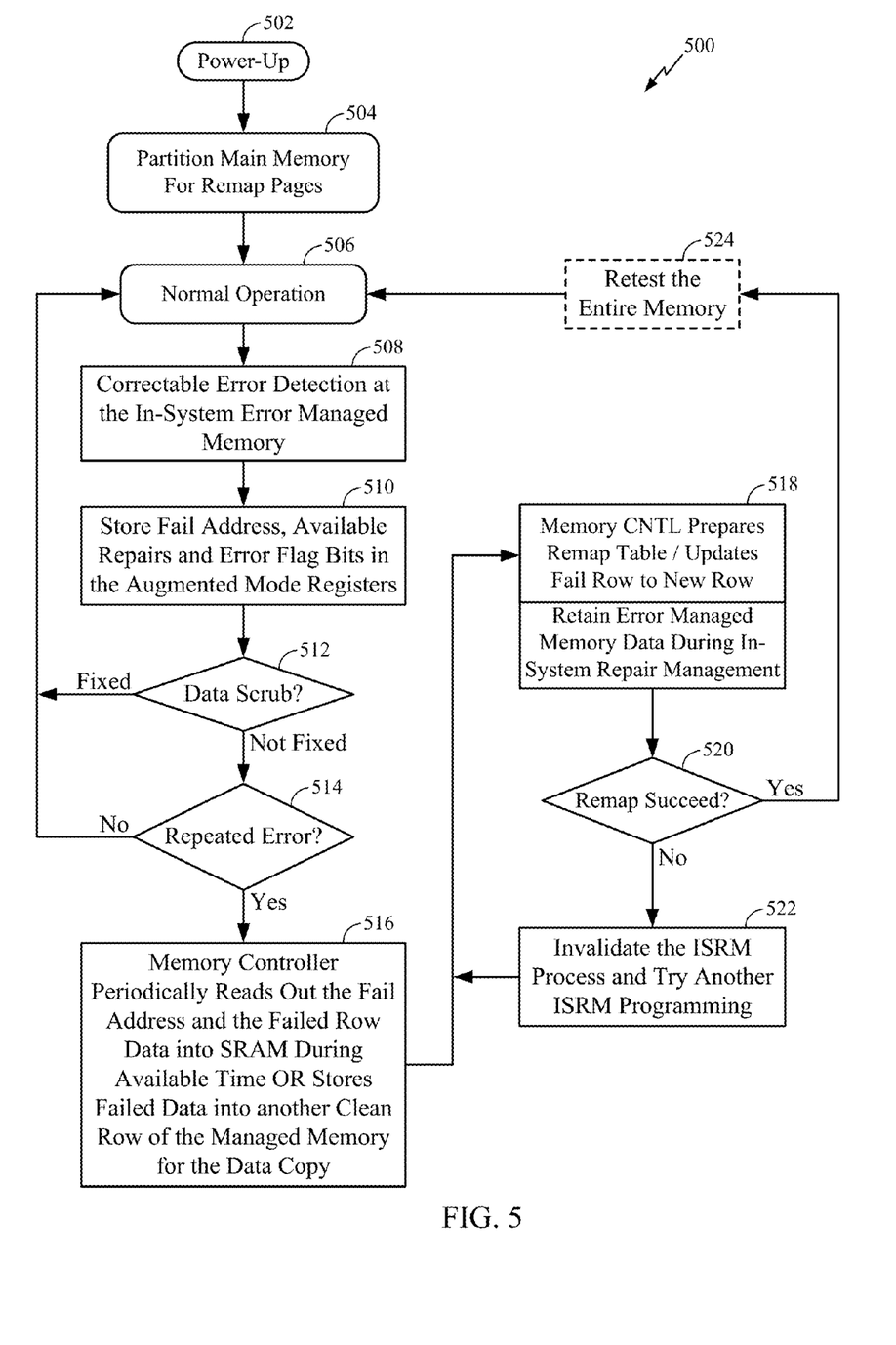
FIG. 5 shows a flow diagram of example operations in a short-term remapping process in association with correctable error, in methods and systems of in-system memory error management according to various aspects.

FIG. 5 shows a flow diagram 500 (hereinafter "flow 500") of example operations in a correctable error remapping process, in methods and systems of in-system memory error management. To avoid duplicitous description, certain operations in the flow 500 will be described in reference to FIG. 1 and to example implementations described in reference to FIG. 4. It will be understood that this is only an example, and is not intended to limit the scope of practices according to the flow 400 to FIG. 1 or 4.

Referring to FIG. 5, operations in the flow 500 can start by a power-up at 502, partitioning at 504 of the DRAM device 114 to reserve remapping pages, then normal mode operation at 506. During the normal mode operation at 506 a correctable error in an access of the DRAM device 114 is detected, at 508, for example, by the error detection logic 122. Next, at 510, associated with, or in response to detecting the correctable error at 508, a fail address, available redundancy information, and error flag bits may be stored in the augmented mode registers 124. In an aspect, operations at 510 may omit sending an error flag to the memory controller 106. After 510, the flow 500 can proceed to 512, where operations can be applied to determine whether a data scrub (or "data scrubbing") of the fail address has been successful. The data scrub at 512 reads (operations not separately visible in FIG. 5) the memory cell(s) of the DRAM device 114, checks the data integrity, detects errors and, for errors determined correctable, corrects the error. The data scrubbing and related detection of its results at 512 may apply conventional data scrubbing techniques. Such techniques are known to persons of ordinary skill in the relevant art and such persons, upon reading this disclosure, can apply these techniques in practices according to disclosed embodiments, without undue experimentation. Further detailed description of conventional data scrubbing techniques is therefore omitted.

Referring to FIG. 5, if the data scrub is determined at 512 as successful, i.e., the error "fixed," operations in the flow 500 may return to normal mode operations at 506. However, if at 512 the data scrub is determined not successful, the flow 500 may, in an aspect, proceed to 514, and determine if the error detected at 508 is a repeated error at the fail address. It will be understood that the determination at 514 is optional. If the determining at 514 is performed, and the answer is "NO," operations in the flow 500 may return to normal mode operations at 506. If the answer at 514 is "YES," operations in the flow 500 can include, at 516, reading out the fail address, and reading out the failed row data from the in-system error managed memory. In an aspect, the reading out at 516 may be performed in a periodic manner, to avoid interfering with ongoing normal mode accesses of the DRAM device 114. Referring to FIGS. 1 and 5, the described reading and storing at 516 may be performed by memory controller 106 reading the fail address and failed row data from the DRAM initial area 114A, through the back channel 119. In one alternative, or supplemental aspect, operations at 516 may comprise reading the data from the fail row and writing it into a clean row (not separately visible in the figures) in the DRAM initial area 114A of the DRAM device 114.

Referring to FIG. 5, a next operation in the flow 500 may be, at 518, an MMU or equivalent preparing a remapping table, and updating the fail row in the DRAM initial area 114A to a new row in the reserved mapping pages. In an aspect, operations at 518 can include retaining the data read from the failed row of the DRAM initial area 114A, for example, in the FIG. 1 local SRAM 110. Operations in the flow 500 can also include, at 520, verifying the write performed at 518 to the new row in the reserved memory pages in the DRAM initial area 114A. In an aspect, if the verifying at 520 shows the write was not successful then, as shown by the 520 "NO" output, there may be, at 522, an invalidating of the current in-system repair management process. In an aspect, also at 522, another in-system repair management process may be applied. If the verifying at 520 shows the write at 518 was successful then, as shown by the 520 "YES" output, the flow 500 may, directly or through an optional testing at 524, return to normal mode operation at 506. The optional testing at 524 may be a retesting, for example, of the entire remaining active memory area of the DRAM initial area 114A.

Figure 6:
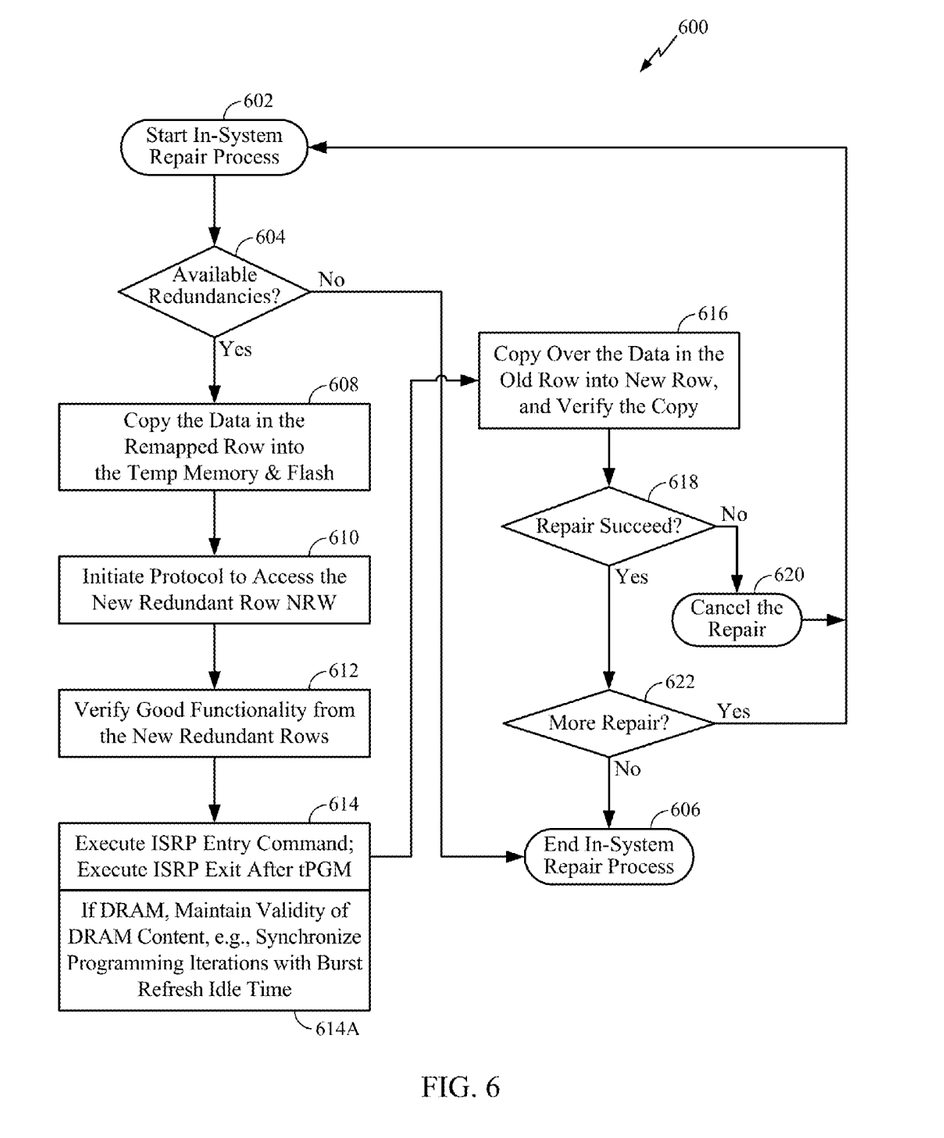
FIG. 6 shows a flow diagram of example operations in an in-system memory reclaiming process in methods and systems of in-system memory error management according to various aspects.

FIG. 6 shows a flow diagram 600 of example operations in an in-system memory error management process, including an in-system repair aspect and an off-line repair aspect in accordance with various aspects.

Referring to FIG. 6, operations in the flow 600 can begin, at 602, with "Start In-System Repair Process." Next, at 604, operations may include determining if the memory being repaired, e.g., the FIG. 1 DRAM device 114, has sufficient available redundancies, e.g., remaining space in the Redundancy 114R, to perform the repair. Referring to FIGS. 1 and 6 together, the determining at 604 may comprise the FIG. 1 memory controller 106 accessing, e.g., over the back channel 119, the augmented mode registers 124 and reading the error address and available redundancy information. If the answer at 604 is "NO", the flow 600 may proceed to 606, and end the in-system repair process. It will be understood "end the in-system repair process" does not necessarily cause system failure. For example, the DRAM device 114 may continue to operate using the re-mapping, for example, as performed at 416-420 in the FIG. 4 flow 400. Referring to FIG. 6, if sufficient redundancy is determined at 604, operations in the flow 600 may, at 608, copy the data in the remapped row into a temporary memory and/or flash memory. For example, referring to FIG. 1, operations at 608 may be performed by the memory controller 106 accessing, through the back channel 119 and the DRAM local control logic 116, the remapped row in the DRAM initial area 114A, and storing the data in the local SRAM 110. Operations in the flow 600 may then, at 610, initiate a protocol to access the new redundant row, which is arbitrarily labeled on FIG. 6 as "NRW." Referring to FIG. 1, operations at 610 may be performed by the memory controller 106, through the back channel 119 and the DRAM local control logic 116.

Continuing to refer to FIG. 6, assuming good functionality of the NRW is verified at 612, the flow 600 may proceed to 614, execute an in-system repair entry command, e.g., which is arbitrarily labeled "ISRP Entry Command" on FIG. 6. In an aspect, after executing the in-system repair entry command, the flow 600 may wait a predetermined time interval "tPGM," then execute an in-system repair exit command, e.g., "ISRP Exit Command. In an aspect, circuitry (not separately labeled in the figures) may be configured to respond to the ISRP Entry Command by programming the ISRP_FUSE_BLK 132 to make the NRW a replacement for a row at the failed address.

In an aspect, for repair of a DRAM device such the DRAM device 114, the programming at 614 can include operations at 614A of maintaining a validity of a content of the DRAM device. Operations at 614A can include, for example, performing the programming, e.g., blowing of fuses in the ISRP_FUSE_BLK 132 in iterations, and synchronizing the iterations to the refresh of the DRAM device 114. For example, the DRAM device 114 may be configured to perform, through the DRAM control block 126, a conventional periodic burst refreshing, with refresh bursts (not explicitly visible in FIG. 6) spaced apart by a refresh period. In an aspect, the refresh bursts may have a burst duration (not explicitly visible in FIG. 6), substantially shorter than the refresh period. In an aspect, the difference between the refresh period and the burst duration may be exploited as a refresh idle time. Referring to FIGS. 1 and 6, in an aspect, the programming the ISRP_FUSE_BLK 132 may be configured as N iterations, each performed during one of the refresh idle times. As will be understood by a person of ordinary skill in the art upon reading this disclosure, the value of N can depend on the duration of the refresh idle times, the size of the fail address, i.e., the number of fuses or anti-fuses in the ISRP_FUSE_BLK 132 that must be blown, and the rate at which the fuses or anti-fuses can be blown.

Continuing to refer to FIG. 6, after the programming at 614 and/or at 614A, operations in the flow 600 may include, at 616, copying the data in the remapped row, from the temporary memory (e.g., the local SRAM 110) or flash (e.g., flash memory 112) where it was held as a copied data during the programming, into NRW. In an aspect, operations at 616 may include verifying the copy over into NRW. Further to this aspect, if the verifying at 616 shows the copy over was not successful, operations in the flow 600 may include, as shown by the decision block 618, a canceling of the repair at 620. In an aspect, after canceling the repair at 620, operations in the flow 600 may include returning to the start system repair process at 602, and making a second attempt at the programming.

Referring to FIG. 6, in an aspect, assuming the verifying at 616 shows the repair successful, i.e., a "YES" at 618, operations in the flow 600 can include determining at 622 if more repair is needed, i.e., if more fuses in the ISRP_FUSE_BLK 132 require programming. If the answer at 622 is "YES," operations in the flow 600 can include returning to the start system repair process at 602, and attempting another iteration. If the answer at 622 is "NO," the flow may, at 606, end the in-system repair process.

Figure 7:
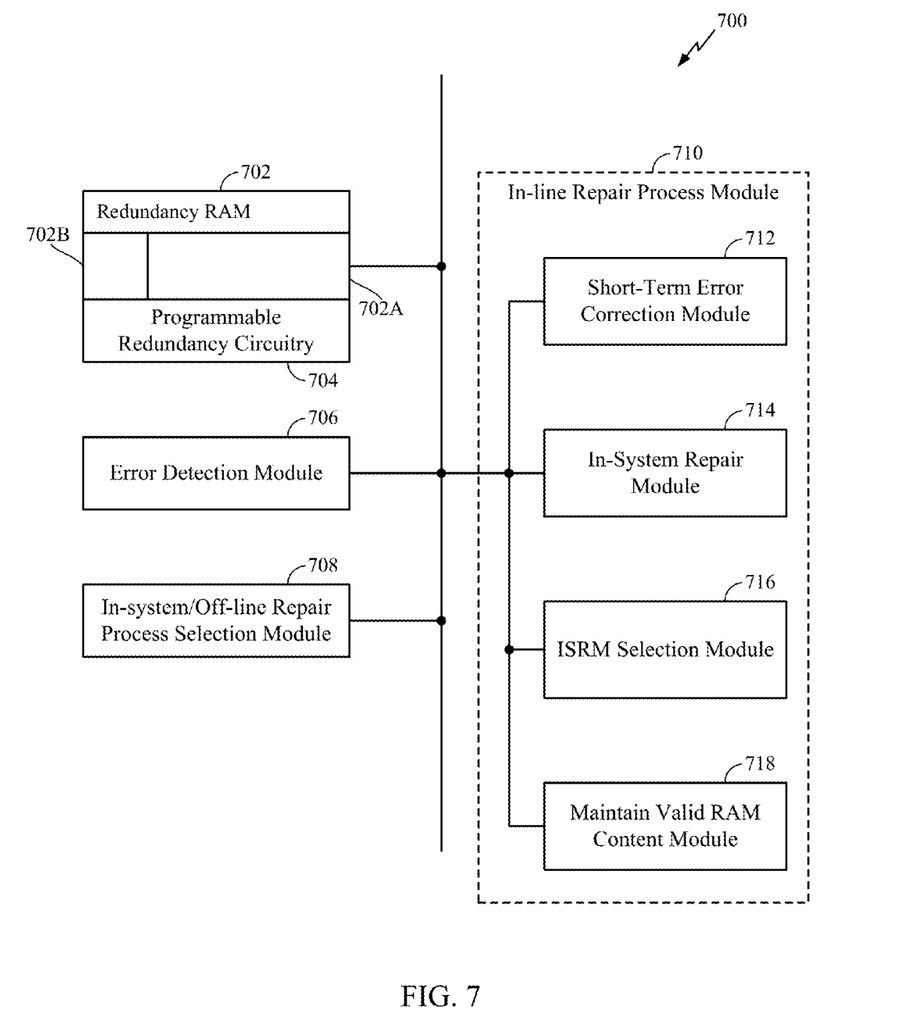
FIG. 7 shows a functional module schematic of one example processor system with in-system error managed memory, configured according to one or more aspects.

FIG. 7 shows a functional module block schematic of one example apparatus 700 with in-system error managed memory, configured in accordance with one or more exemplary embodiments. Referring to FIG. 7, the apparatus 700 may include a redundancy RAM 702 having a normal cell area 702A, and having a redundancy cell area 702B. The redundancy RAM 702 may be implemented, for example, in whole or in part, by the FIG. 1 DRAM device 114, having a DRAM initial area 114A and Redundancy 114R. In an aspect, the apparatus 700 may include a programmable redundancy circuitry 704, to permanently store a one-time programmed mapping of a fail address to an address in the redundancy cell area 702B. Referring to FIGS. 1 and 7, the programmable redundancy circuitry 704 may be implemented, for example, by the FIG. 1 ISRP_FUSE_BLK 132 or equivalent circuitry.

Continuing to refer to FIG. 7, the apparatus 700 may include an error detection module 706. The error detection module 706 may be configured to detect error in data accessed in the redundancy RAM 702 and, in response, generate an error flag or equivalent notice, and an associated error information, e.g., a fail address. The error detection module 706 may be configured to determine whether the detected error is a correctable error or an uncorrectable error. Referring to FIGS. 1 and 7, one example implementation of the error detection module 706 may include the error detection logic 122 of the DRAM local control logic 116 that, as previously described, may generate an error flag Referring to FIG. 7, the apparatus 700 may include an in-system/off-line repair process selection module 708 that may be configured to select, based on a given criterion of in-line repair, between an in-line repair process and an off-line repair process. Referring to FIGS. 1, 2, and 7, example functionality of the in-system repair process selection module 708 can include operations at 206 of selecting between the in-line repair process at 208 and the off-line repair process at 210. As described previously in this disclosure, e.g., in reference to FIG. 1, the selecting may be based on a given criterion, or criteria, for determining whether fail address is repairable in-line.

Referring to FIG. 7, the apparatus 700 may include an in-line repair process module 710. In an aspect, the in-line repair process module 710 can include a short term error correction module 712 and an in-system repair module 714. The short term error correction module 712 can be configured to perform, for example, in response to the error detection module 706 detecting a bit error, a temporary or short term remapping of the fail address, e.g., a fail row address, to a remapped memory area in the normal cell area 702A of the redundancy RAM 702. As previously described, the remapped memory area may be within a larger, reserved area in the normal cell area 702A, such as the reserved remapping pages.

In an aspect, the in-line repair process module 710 can also include an in-system repair management (ISRM) selection module 716. In an aspect, the ISRM selection module 716 may be configured to select between an uncorrectable error ISRM process (e.g., the FIG. 4 flow 400) and a correctable error ISRM process (e.g., the FIG. 5 flow 500). The ISRM selection module 716 may be configured make the selection based, for example, on a determination by the error detection module 706 as to whether the detected bit error is a correctable error or an uncorrectable error.

As described earlier in reference to FIG. 7, the apparatus 700 may include an in-system repair module 714, which may be configured to provide a one-time programmed remapping of the fail address to a redundancy area of the memory. In an aspect, the in-system repair module 714 can be configured to one-time program the programmable redundancy circuitry 704 with a remapping of the fail address to the redundancy cell area 702B. Referring to FIGS. 6 and 7, the in-system repair module 714 may be configured to perform and/or control all operations in the flow 600.

Referring to FIGS. 1 and 7, example implementations of the in-system repair module 714 may include the FIG. 1 DRAM control block 126, as well as the command address block 128, the augmented mode registers 124, and the memory controller 106. The implementation can also include an associated memory, e.g., the local SRAM 110 or other the memory, storing computer-executable instructions (not separately visible in FIG. 1) that, when executed by the memory controller 106 and other circuitry, cause the memory controller 106 to perform operations according to the flow FIG. 6 flow 600.

Referring still to FIG. 7, in an aspect, the in-line repair process module 710 may also include a maintain valid RAM content module 718. The maintain valid RAM content module 718 may be configured to identify an idle time of the redundancy RAM 702 and to control, or communicate with the in-system repair module 714 to perform, for example, one-time programming of the programmable redundancy circuitry 704 during the idle time. In a further aspect, the maintain valid RAM content module 718 may be configured to control, or provide information to the in-system repair module 714 to perform the described one-time programming in an iterative manner, in synchronization with the refresh bursts.

The functionality of the modules of FIG. 7 may be implemented in various ways consistent with the present description. For example, the functionality of the FIG. 7 modules may be implemented as one or more electrical components. In an aspect, functionality of the FIG. 7 modules may be implemented as a processing system, such as the FIG. 1 example, as other implementations including one or more processor components. In an aspect, the functionality of the FIG. 7 modules may be implemented using, for example, at least a portion of one or more integrated circuits (e.g., an ASIC). It will be appreciated by those skilled in the art that a given subset (e.g., of an integrated circuit and/or of a set of software modules) may provide at least a portion of the functionality for more than one module. As one specific non-limiting example, the apparatus 700 may comprise a single device (e.g., the redundancy RAM 702, programmable redundancy circuitry 704, error detection module 706 and other of the modules 708 through 716 comprising different sections of an ASIC). As another specific non-limiting example, the apparatus 700 may comprise multiple devices (e.g., the redundancy RAM 702, programmable redundancy circuitry 704 comprising one ASIC, modules 708, 712 and 716 comprising another ASIC, and error detection module 706, an ISRM selection module 716 and in-system repair module 714 comprising yet another ASIC).

The foregoing disclosed devices and functionalities, e.g., as described in reference to any one or more of FIGS. 1-7, may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative aspects of the invention, it should be noted that various changes and modifications could be made herein without departing from the scope of the invention as defined by the appended claims.

What is claimed is:

1. A method for repair of a memory comprising:
   detecting an error, as a detected error, wherein the detected error is associated with accessing the memory, and wherein the detected error is located at a fail address in the memory; and
   upon detecting the error, selecting a repair process, based on a selection criterion, wherein the repair process is selected from the group consisting of an in-line repair process and an off-line repair process; and
   upon selecting the in-line repair process, performing the in-line repair process, wherein performing the in-line repair process includes:
   applying a short-term error correction, wherein the short-term error correction comprises a short-term remapping of the fail address in the memory to a remapped memory area of the memory, and
   upon a successful completion of the short-term error correction, applying an in-system repair, comprising determining if there is sufficient available repair time, and if there is sufficient available repair time, performing a one-time programmed remapping of the fail address from the remapped memory area to a redundancy area of the memory.

2. The method of claim 1, wherein the in-line repair process includes maintaining a validity of a content of the memory during the short-term error correction and during applying the in-system repair.

3. The method of claim 2, wherein maintaining the validity of the content of the memory includes:
   identifying an idle time of the memory, during a normal mode operation; and
   one-time programming into a redundancy circuit, during the idle time, the one-time programmed remapping of the remapped memory area to a redundancy area of the memory.

4. The method of claim 1, wherein, the method includes partitioning the memory for remapping pages, wherein the fail address includes a fail row, and wherein the short-term error correction includes:
   preparing a remapping table that remaps the fail row to a new row in a remapping page among the remapping pages;
   determining whether the remapping of the fail row to the new row in the remapping page is successful; and
   upon determining the remapping of the fail row to the new row in the remapping page is successful, ending the short-term error correction and determining the successful completion of the short-term error correction, and
   upon determining the remapping of the fail row to the new row in the remapping page is not successful, invalidating the remapping of the fail row to the new row.

5. The method of claim 1, wherein applying the in-system repair includes determining whether there is a sufficient remaining area in the redundancy area of the memory to enable the successful completion of the in-system repair and, upon determining there is not a sufficient remaining area in the redundancy area of the memory to enable the successful completion of the in-system repair, terminating the in-system repair.

6. The method of claim 5, wherein applying the in-system repair includes:
   determining whether a normal mode operation of the memory provides the sufficient available repair time, wherein the sufficient available repair time enables performing a one-time programming of the one-time programmed remapping of the remapped memory area to the redundancy area of the memory; and upon determining the normal mode operation of the memory does not provide the sufficient available repair time, ending the in-system repair and returning to normal mode operation.

7. The method of claim 6, wherein available repair time includes time within idle times associated with a normal mode operation.

8. The method of claim 1, wherein applying the in-system repair includes:

copying a data from the remapped memory area to a temporary memory, as a copied data;

applying a one-time programming to a redundancy circuitry, of a remapping of at least a portion of the fail address to an area in the redundancy area of the memory; and copying at least a portion of the copied data from the temporary memory to the area in the redundancy area of the memory.

9. The method of claim 8, wherein applying the in-system repair further comprises, after copying at least a portion of the copied data from the temporary memory to the area in the redundancy area of the memory, performing a copy verify, wherein the copy verify is configured to determine between success and failure of the copying the at least a portion of the copied data from the temporary memory to the area in the redundancy area of the memory; and upon the copy verify determining failure of the copying the at least a portion of the copied data from the temporary memory to the area in the redundancy area of the memory, canceling the in-system repair.

10. The method of claim 1, wherein applying the in-system repair includes:

(i) copying a row of data in the remapped memory area to a temporary memory, as a copied row data;

(ii) applying a one-time programming to a redundancy circuitry of a remapping of a fail row address to a new row in the redundancy area of the memory;

(iii) copying the copied row data from the temporary memory to the new row in the redundancy area of the memory;

(iv) performing a copy verify wherein the copy verify is configured to determine between success and failure of the copying of the copied row data from the temporary memory to the new row in the redundancy area of the memory; and (v) upon the copy verify determining failure of the copying of the copied row data from the temporary memory to the redundancy area of the memory, canceling the in-system repair.

11. The method of claim 10, wherein applying the in-system repair further includes:

(vi) upon determining success of the copying of the copied row data from the temporary memory to the new row in the redundancy area of the memory, determining whether another applying the in-system repair is required and, upon determining another applying the in-system repair is required, repeating (i) through (vi), else ending the in-system repair.

12. The method of claim 1, wherein detecting the error further includes determining between a correctable error and an uncorrectable error, and wherein the short-term error correction is based, in part, on said determining.

13. The method of claim 12, wherein, in response to determining the detected error is an uncorrectable error, the short-term error correction comprises:

storing the fail address in a memory register associated with the memory and sending an error flag from the memory to a controller;

reading, by the controller, of the fail address from the memory register;

preparing, under control of the controller, a remapping table having the short-term remapping;

determining whether a remapping, according to the remapping table having the short-term remapping, of the fail address to the remapped memory area of the memory is successful; and upon determining the remapping of the fail address to the remapped memory area of the memory is successful, ending the short-term error correction and determining the successful completion of the short-term error correction, and upon determining the remapping of the fail address to the remapped memory area in the memory is not successful, invalidating the short-term remapping.

14. The method of claim 13, wherein in response to determining the detected error is an uncorrectable error, the short-term error correction further comprises:

prior to determining whether the remapping of the fail address to the remapped memory area in the memory is successful, checking whether a golden data is in another memory, wherein determining whether the remapping of the fail address to the remapped memory area in the memory is successful is based, in part, on a result of the checking.

15. The method of claim 14, wherein, in response to a result of the checking indicating the golden data is in another memory, determining whether the remapping of the fail address to the remapped memory area in the memory is successful comprises:

writing, to the remapped memory area in the memory, the golden data; and verifying the writing.

16. The method of claim 14, wherein, in response to a result of the checking indicating the golden data is not in another memory, the determining whether the remapping of the fail address to the remapped memory area in the memory is successful comprises:

writing, to the remapped memory area of the memory, a predefined pattern; and verifying the writing.

17. The method of claim 14, wherein checking the another memory includes checking a cache, a flash memory, or both.

18. The method of claim 12, wherein the short-term error correction, in response to determining the detected error is a correctable error, comprises:

performing a data scrub on a data corresponding to the correctable error;

upon a successful result of the data scrub, ending the short-term error correction and returning to a normal mode operation; and upon an unsuccessful result of the data scrub, determining whether the correctable error is a repeated error; and upon determining the correctable error is not a repeated error ending the short-term error correction and returning to a normal mode operation.

19. The method of claim 18, wherein, the method includes partitioning the memory for remapping pages, wherein the fail address includes a fail row, and wherein the short-term error correction further comprises:

upon detecting the correctable error, storing the fail address in a memory register and storing an error flag in the memory register;

reading the fail address from the memory register by a memory controller and, in response, preparing a remapping table that remaps the fail row to a new row in a remapping page among the remapping pages;

determining whether the remapping of the fail row to the new row in the remapping page is successful; and upon determining the remapping of the fail row to the new row in the remapping page is successful, ending the short-term error correction and determining the successful completion of the short-term error correction, and upon determining the remapping of the fail row to the new row in the remapping page is not successful, invalidating the remapping of the fail row to the new row.

20. The method of claim 19, further comprising:

reading the fail address from the memory register, reading out a failed row data from the fail address in the memory;

storing the failed row data in a static another memory; and copying the failed row data from the static another memory to the new row in the remapping page.

21. The method of claim 19, further comprising:

upon reading the fail address from the memory register, reading out a failed row data from the fail address in the memory;

storing the failed row data in a clean row in the memory; and copying the failed row data from the clean row in the memory to the new row in the remapping page.

22. An apparatus for in-system repair management of a memory comprising:

means for detecting, during a normal mode operation of the memory, an error and a corresponding fail address in the memory; and means for selecting, upon detecting the error, a repair process, wherein the selecting selects the repair process from the group consisting of an in-line repair process and an off-line repair process, and wherein the selecting is based, at least in part, on a given selection criterion; and means for performing the in-line repair process, comprising means for applying a short-term error correction that, upon successful completion, includes a short-term remapping of the fail address in the memory to a remapped memory area of the memory, and means for applying an in-system repair, wherein the in-system repair includes determining if there is sufficient available repair time, and if there is sufficient available repair time, performing a one-time programmed remapping of the fail address from the remapped memory area to a redundancy area of the memory.

23. The apparatus of claim 22, wherein the means for performing the in-line repair process includes means for maintaining a validity of a content of the memory, during the short-term error correction and during applying the in-system repair.

24. The apparatus of claim 23, wherein the means for maintaining the validity of the content of the memory is configured to perform periodic burst refresh of the memory while applying the short-term error correction, and while applying the in-system repair.

25. An apparatus for in-system memory repair management, comprising a memory, having a normal area and a redundancy area;

an error detection module, configured to detect an error in an access of the memory, as a detected error, wherein the detected error is located at a fail address in the memory, and, in response, to generate an error notice and the fail address;

an in-system/off-line repair process selection module, wherein the in-system/off-line repair process selection module is configured to select, upon the error notice, a repair process from the group consisting of an in-line repair process and an off-line repair process, and wherein the selecting is based, at least in part, on a given selection criterion; and an in-line repair process module, wherein the in-line repair process module comprises a short-term error correction module, configured to perform a short-term remapping of the fail address to a remapped memory area, wherein the remapped memory area is in the normal area of the of the memory, an in-system repair module, wherein the in-system repair module is configured to determine if there is sufficient available repair time, and if there is sufficient available repair time, one-time program a redundancy circuitry with a one-time programmed remapping of the fail address from the remapped memory area to the redundancy area of the memory.

26. The apparatus for in-system memory repair management of claim 25, wherein the in-line repair process module further includes:

a maintain valid memory content module, configured to maintain validity of a content of the normal area of the memory during operations of the short-term error correction module and during operations of the in-system repair module.

27. The apparatus for in-system memory repair management of claim 26, wherein the maintain valid memory content module is configured to identify an idle time of the memory, and to control the in-system repair module to one-time program the redundancy circuitry, with the one-time programmed remapping of the fail address to the redundancy area of the memory, during the idle time.

28. The apparatus for in-system memory repair management of claim 26, wherein the maintain valid memory content module is configured to perform periodic burst refresh of the memory while the short-term error correction module applies the short-term remapping of the fail address to a remapped memory area, and while the in-system repair module performs the one-time programming of the remapping of the fail address to the redundancy area of the memory.

29. The apparatus for in-system memory repair management of claim 25, wherein the in-line repair process module further comprises an in-system repair management selection module, configured to select between an uncorrectable error in-system repair management and a correctable error in-system repair management, based on a determination by the error detection module as to whether the detected error is a correctable error or an uncorrectable error, and wherein the short-term error correction module is configured to select operations based upon a selecting by the in-system repair management selection module.

30. A computer product having a non-transitory computer readable medium comprising instructions that, when read and executed by a processor, cause the processor to:

detect an error, during a normal mode operating of a memory, and wherein the detected error is located at a fail address in the memory;

select, upon detecting the error, a repair process, based on a section criterion, wherein the repair process is in the group consisting of in-line repair process and an off-line repair process; and upon selecting the in-line repair process, to apply a short-term error correction, wherein the short-term error correction is configured to provide a short-term remapping of the fail address in the memory to a remapped memory area of the memory, and upon a successful completion of the short-term error correction, to apply an in-system repair, configured to, determine if there is sufficient available repair time, and if there is sufficient available repair time, provide a one-time programmed remapping of the fail address from the remapped memory area to a redundancy area of the redundancy memory.

* * * * *